United States Patent
Kwon et al.

(10) Patent No.: US 9,482,726 B2
(45) Date of Patent: Nov. 1, 2016

(54) FABRICATING METHOD OF MAGNETIC AXIS CONTROLLED STRUCTURE

(75) Inventors: Sunghoon Kwon, Seoul (KR); Hyoki Kim, Seoul (KR); Junhoi Kim, Seoul (KR); Howon Lee, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 648 days.

(21) Appl. No.: 13/039,611

(22) Filed: Mar. 3, 2011

(65) Prior Publication Data

US 2011/0221431 A1 Sep. 15, 2011

(30) Foreign Application Priority Data

Mar. 3, 2010 (KR) .......... 10-2010-0019117
Apr. 21, 2010 (KR) .......... 10-2010-0036769

(51) Int. Cl.
*G01R 33/02* (2006.01)
*B05D 5/12* (2006.01)
*G01R 33/12* (2006.01)
*B05D 3/00* (2006.01)
*B05D 3/06* (2006.01)

(52) U.S. Cl.
CPC .......... *G01R 33/1269* (2013.01); *B05D 3/207* (2013.01); *G01R 33/1276* (2013.01); *B05D 3/067* (2013.01)

(58) Field of Classification Search
CPC .......... B01J 19/12; G02F 1/09; G02F 1/29; B05D 3/207; G01R 33/1269; G01R 33/1276; G01R 3/067
USPC ....................................... 324/246
See application file for complete search history.

(56) References Cited

U.S. PATENT DOCUMENTS 5,545,885 A * 8/1996 Jagielinski .......... 235/449
6,310,475 B1 * 10/2001 Kawase .......... G01D 5/145
194/317

OTHER PUBLICATIONS

Kim et al. "Structural colour printing using a magnetically tunable and lithographically fixable photonic crystal", Aug. 23, 2009, Nature Photonic, vol. 3, pp. 534-540, doi:10.1038/nphoton.2009.141 http://binel.snu.ac.kr/documentation-images/papers/nphoton.2009.141.pdf.*
Kim et al. "Structural colour printing using a magnetically tunable and lithographically fixable photonic crysta Suppllementary Information", Aug. 23, 2009, Nature Photonic, vol. 3, pp. 1-18, doi:10.1038/nphtoon.2009.141 http://binelx.snu.ac.kr/documentation-images/papers/nphoton.2009.141-s1.pdf.*
Hyoki Kim et al., Structural colour printing using a magnetically tunable and . . . , Supplementary Information of Nature Photonics 3, pp. 534-540, Aug. 23, 2009.

* cited by examiner

*Primary Examiner* — Jermele M Hollington
*Assistant Examiner* — Haidong Zhang
(74) *Attorney, Agent, or Firm* — STIP Law Group, LLC (57) ABSTRACT

Provided is a method of fabricating a magnetic axis-controlled structure. The method of fabricating a magnetic axis-controlled structure includes providing a composition including magnetic nanoparticles dispersed in a liquid medium, applying a magnetic field to the composition to align the magnetic nanoparticles along the magnetic field and form a magnetic axis, and solidifying the liquid medium to fix the magnetic axis.

4 Claims, 6 Drawing Sheets

FABRICATING METHOD OF MAGNETIC AXIS CONTROLLED STRUCTURE

CROSS REFERENCE TO PRIOP APPLICATIONS

The present application claims priority under 35 U.S.C. §119 to Korean Patent Applications Nos. 10-2010-0019117 (filed on Mar. 3, 2010) and 10-2010-0036769 (filed on Apr. 21, 2012), which are all hereby incorporated by reference in their entirety.

TECHNICAL FIELD

The described technology relates generally to a method of fabricating a magnetic axis-controlled structure and, more particularly, to a simple method of fabricating a structure having magnetic axes in various directions.

BACKGROUND

Magnetism is a property of materials that are magnetized in a magnetic field, and is classified into paramagnetism, diamagnetism, ferromagnetism, superparamagnetism, etc. according to characteristics. When a magnetic field is applied to the outside of a material, magnetic moments of atoms are aligned by the magnetic field, and a characteristic of the magnetism is classified according to the alignment characteristic of the magnetic moments. In general, the magnetic property of a material is unique, and two or more magnetic materials are frequently combined into an alloy to adjust the magnetic property.

A method of producing various magnetic nanoparticles is disclosed in a recent paper "Chemical synthesis of magnetic nanoparticles" Taeghwan Hyeon, CHEM. COMMUN., 2003, 927-934. This paper discloses a method of producing various magnetic nanoparticles such as oxidized steel nanoparticles in the colloidal state, iron-platinum compound nanoparticles, and iron-cobalt compound nanoparticles.

Methods of adjusting a magnetic property using magnetic nanoparticles are attracting attention as technology that can be widely used in the field of information storage devices and sensors.

SUMMARY

In one embodiment, a method of fabricating a magnetic axis-controlled structure is provided. The method of fabricating a magnetic axis-controlled structure includes: providing a composition including magnetic nanoparticles dispersed in a liquid medium; applying a magnetic field to the composition to align the magnetic nanoparticles along the magnetic field and form a magnetic axis; and solidifying the liquid medium to fix the magnetic axis.

In another embodiment, a method of forming magnetic axes-controlled multiple patterns is provided. The method of forming magnetic axes-controlled multiple patterns includes: providing a substrate; forming a composition layer including magnetic nanoparticles dispersed in a curing material on the substrate; applying a magnetic field to a portion of the composition layer to align the magnetic nanoparticles in parallel with a direction of the magnetic field and form a magnetic axis; photocuring the composition layer to fix the magnetic axis; and forming multiple patterns by repeating forming and fixing of magnetic axes while changing at least one of the intensity and direction of the magnetic field for several portions of the composition layer.

In still another embodiment, multiple patterns having controlled magnetic axes are provided. The multiple patterns include a solid medium and a plurality of areas in which the magnetic axes are fixed in the solid medium. Here, the magnetic axis has an alignment structure of magnetic nanoparticles aligned in one axial direction at predetermined intervals. Also, each of the plurality of areas includes magnetic axes in a specific direction, and magnetic axes of different areas are in the same direction or different directions.

In yet another embodiment, a method of measuring induced magnetic forces of multiple patterns having controlled magnetic axes is provided. The method of measuring induced magnetic forces of multiple patterns having controlled magnetic axes includes: applying a magnetic field to the multiple patterns having the controlled magnetic axes; and scanning the multiple patterns having the controlled magnetic axes using a magnetic sensor while applying the magnetic field. Here, the multiple patterns include a solid medium; and a plurality of areas in which the magnetic axes are fixed in the solid medium. The magnetic axis has an alignment structure of magnetic nanoparticles aligned in one axial direction at predetermined intervals. Each of the plurality of areas includes magnetic axes in a specific direction, and magnetic axes of different areas are in the same direction or different directions.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

BRIEF DESCRIPTION OF THE DRAWINGS

The above and other features and advantages of the present disclosure will become more apparent to those of ordinary skill in the art by describing in detail example embodiments thereof with reference to the attached drawings in which.

DETAILED DESCRIPTION

It will be readily understood that the components of the present disclosure, as generally described and illustrated in the Figures herein, could be arranged and designed in a wide variety of different configurations. Thus, the following more detailed description of the embodiments of apparatus and methods in accordance with the present disclosure, as represented in the Figures, is not intended to limit the scope of the disclosure, as claimed, but is merely representative of certain examples of embodiments in accordance with the disclosure. The presently described embodiments will be best understood by reference to the drawings, wherein like parts are designated by like numerals throughout.

Meanwhile, terms used herein are to be understood as follows.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," "on" versus "directly on," etc.).

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
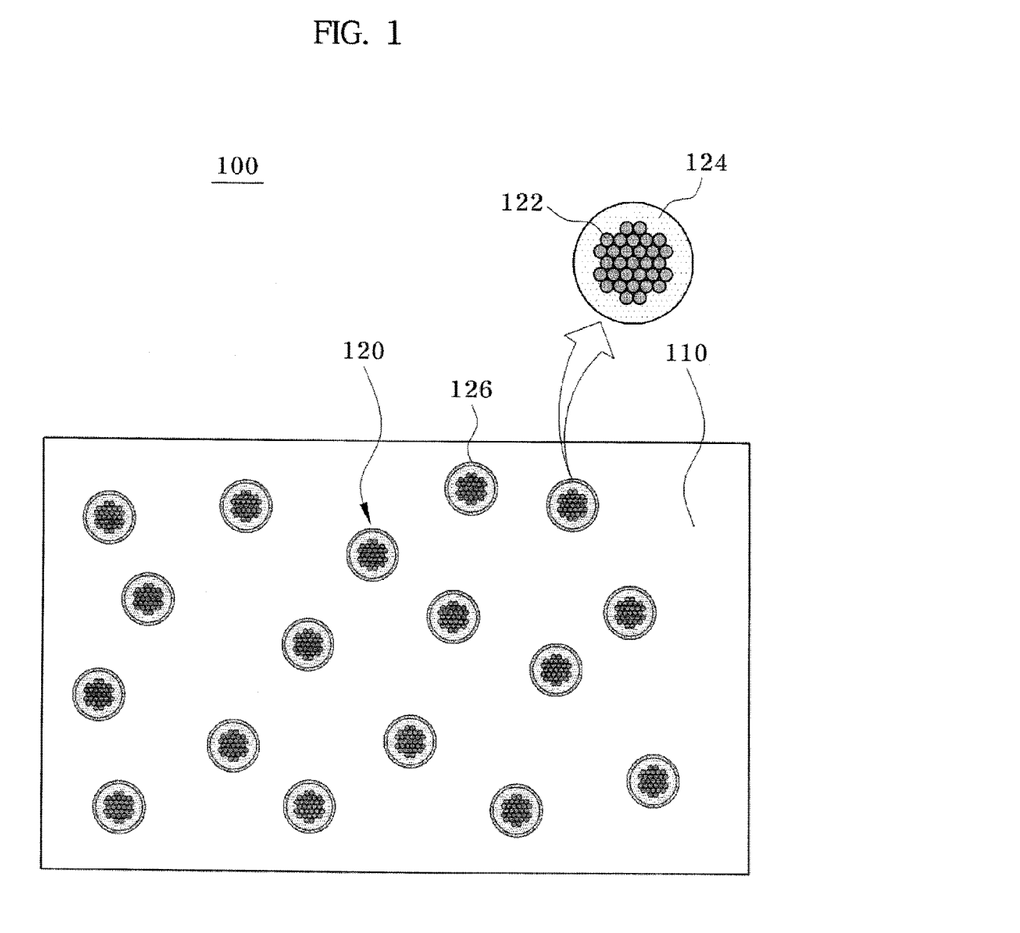
FIG. 1 illustrates a composition for fabricating a magnetic axis-controlled structure according to an embodiment of the present disclosure.

FIG. 1 illustrates a composition for fabricating a magnetic axis-controlled structure according to an embodiment of the present disclosure. Referring to FIG. 1, a composition 100 for fabricating a magnetic axis-controlled structure may include a curing material 110 and magnetic nanoparticles 120 dispersed in the curing material 110.

The magnetic nanoparticles 120 may include clusters 122 of magnetic nanocrystals. The magnetic nanoparticles 120 may have a size of tens to hundreds of nanometers, and the magnetic nanocrystals may have a size of several to tens of nanometers. The magnetic nanocrystals may include, for example, a magnetic material or a magnetic alloy. The magnetic material or the magnetic alloy may be at least one selected from the group of Co, $Fe_3O_4$, $CoFe_2O_4$, MnO, $MnFe_2O_4$, CoCu, CoPt, FePt, CoSm, NiFe, and NiFeCo.

The magnetic nanoparticles 120 may include a superparamagnetic material. Unlike a ferromagnetic material whose magnetism is maintained even if a magnetic field is removed, the superparamagnetic material has magnetism only when an external magnetic field exists. In general, a ferromagnetic material can be phase-changed into a superparamagnetic material when the particle size becomes several to hundreds of nanometers. For example, oxidized iron can have superparamagnetism with a particle size of about 10 nm.

As shown in the drawing, the magnetic nanoparticles 120 may have a shell layer 124 surrounding a core consisting of the clusters 122 of magnetic nanocrystals. The shell layer 124 causes the magnetic nanoparticles 120 to be evenly dispersed in the curing material 110. The shell layer 124 may promote solvation repulsion on the surfaces of the respective magnetic nanoparticles 120 to offset a strong magnetic attraction between the magnetic nanoparticles 120, which will be described later. The shell layer 124 may include, for example, silica, titania, polymer such as polystyrene (PS) and polymethylmethacrylate (PMMA). For example, when surface modification is performed using silica as the shell layer 124, a well-known sol-gel process may be used.

The composition 100 for fabricating a magnetic axis-controlled structure may also further include a hydrogen-bonding solvent. As the hydrogenbonding solvent, various alkanol solvents such as ethanol, isopropyl alcohol, and ethylene glycol may be used. Here, a solvation layer 126 surrounding each of the magnetic nanoparticles 120 may be formed. For example, the solvation layer 126 is formed under the influence of a silanol (Si—OH) functional group on the surface of the shell layer 124 having silica so that a repulsive force can be induced between the magnetic nanoparticles 120. In an embodiment, the shell layer 124 and/or the solvation layer 126 may not exist in the magnetic nanoparticles 120. In this case, a static electricity force of the surfaces of the magnetic nanoparticles 120 may be exerted as repulsion.

The composition 100 for fabricating a magnetic axis-controlled structure may be obtained by mixing the magnetic nanoparticles 120 and the curing material 110 and performing mechanical mixing or an ultrasonic treatment. The magnetic nanoparticles 120 may be included in the curing material 110, for example, at a volume percentage of 0.01 to 20. When the volume percentage of the magnetic nanoparticles 120 is less than 0.01, a magnetic induction response may be reduced. On the other hand, when the volume percentage of the magnetic nanoparticles 120 is more than 20, the magnetic induction response may not increase any more.

The curing material 110 serves as a dispersion medium that stably disperses the magnetic nanoparticles 120 constituting photonic crystals. Also, the curing material 110 may fix an interval between the magnetic nanoparticles 120 by crosslinking so that the same structural color can be continuously maintained even after a magnetic field is removed.

The curing material 110 may include a liquid monomer or oligomer containing a portion that can be crosslinked for a curing reaction. The curing material 110 may include a liquid hydrophilic polymer from which hydrogel can be formed. The hydrophilic polymer has a hydrophilic group and thus is appropriate for dispersion of the magnetic nanoparticles 120. When the hydrophilic polymer is cross-linked by an appropriate energy source to form hydrogel having a three-dimensional (3D) network structure, the magnetic nanoparticles 120 can be fixed.

Examples of the curing material 110 from which hydrogel can be formed may be a silicon-containing polymer, ethoxylated trimethylolpropane triacrylate, 2-hydroxyethyl methacrylate, methyl methacrylate, acrylamide, allylamine, polyethylene oxide, polyethylene glycol diacrylate (PEGDA), polypropylene glycol diacrylate, polyvinylpyrrolidone (PVP), polyvinyl alcohol, polyacrylate, and a combination thereof. For example, PEGDA used as the curing material 110 has an acrylate functional group at both distal ends of polyethylene glycol (PEG), and thus can be crosslinked into 3D hydrogel when free radical polymerization occurs. The curing material 110 may include any media that can be changed from liquid to solid.

The curing material 110 may further include an initiator, and cause free radical polymerization by means of an external energy source. The initiator may be an azo compound or peroxide. The curing material 110 may further include an appropriate crosslinking agent, which is, for example, N,N'-methylene-bis-acrylamide, methylene-bis-methacrylamide, and ethylene glycol methacrylate. An appropriate energy source for the curing reaction may include any of heat, ultraviolet (UV) light, visible light, infrared light, and electron beams. When a magnetic field is applied, the magnetic nanoparticles 120 may be aligned in the curing material 110 and exhibit a structural color.

Figure 2:
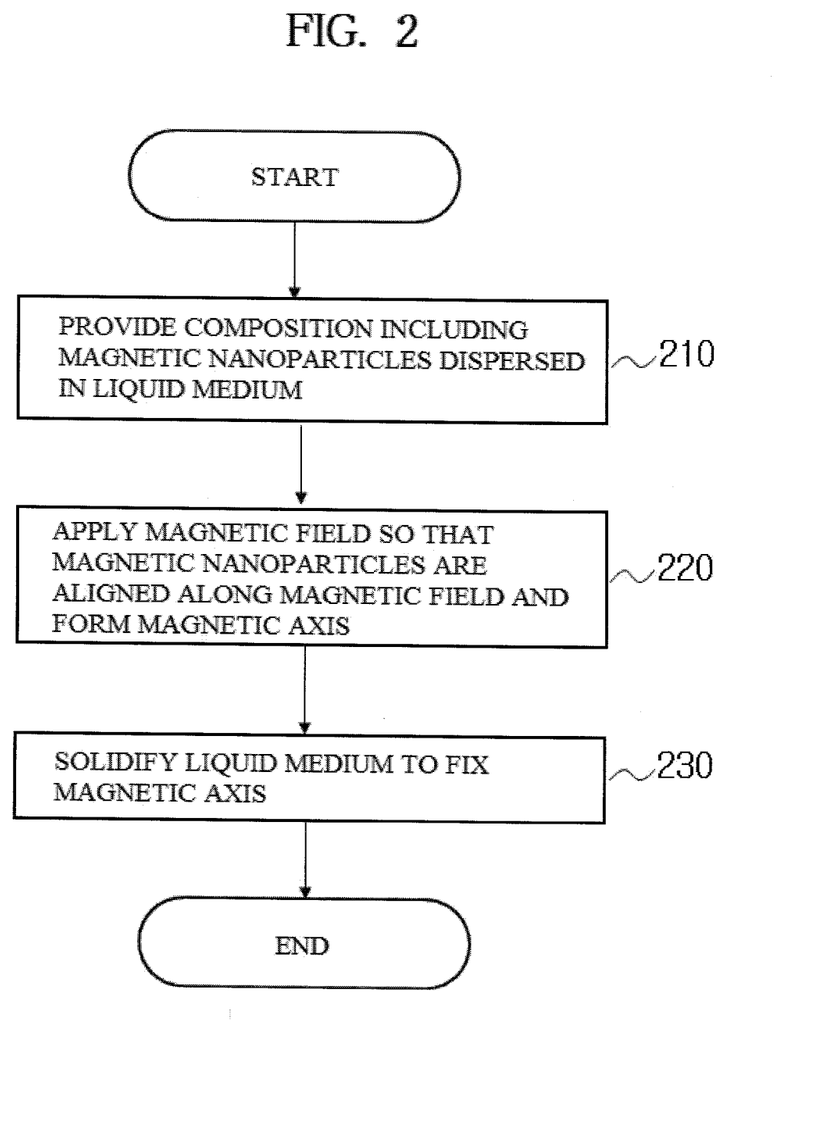
FIG. 2 is a flowchart illustrating a method of fabricating a magnetic axis-controlled structure according to an embodiment of the present disclosure.

FIG. 2 is a flowchart illustrating a method of fabricating a magnetic axis-controlled structure according to an embodiment of the present disclosure. Referring to FIG. 2, in step 210, a composition including magnetic nanoparticles dispersed in a liquid medium is provided. In step 220, a magnetic field is applied to the composition so that the magnetic nanoparticles are aligned along the magnetic field and form a magnetic axis. In step 230, the liquid medium is solidified to fix the magnetic axis, so that a magnetic axis-controlled structure can be fabricated.

Figure 3:
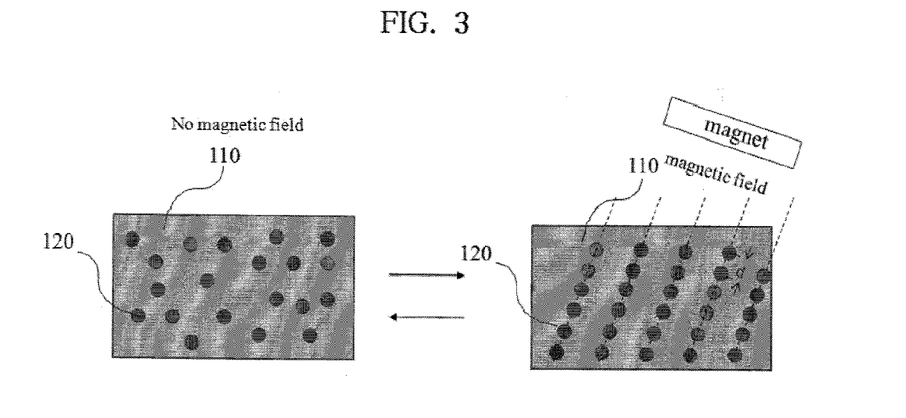
FIG. 3 illustrates a magnetic axis control principle of a composition for fabricating a magnetic axis-controlled structure.

FIG. 3 illustrates a magnetic axis control principle of a composition for fabricating a magnetic axis-controlled structure. Referring to FIG. 3, magnetic nanoparticles 120 are irregularly dispersed in a curing material 110 when a magnetic field is not applied. On the other hand, when a magnetic field is applied by an adjacent magnet, the magnetic nanoparticles 120 are aligned in the direction of the magnetic field and may form a magnetic axis. A distance d between the magnetic nanoparticles 120 forming the magnetic axis may depend on the intensity of the magnetic field. For example, the stronger the intensity of the magnetic field, the smaller the distance d may be. The magnetic nanoparticles 120 aligned in parallel with the direction of the magnetic field may be irregularly dispersed again by removing the magnetic field. A magnetic field denotes a spatial axis exhibiting the strongest induced magnetism in a unit volume. One magnetic nanoparticle has induced magnetism according to permeability when exposed to a magnetic field. Respective magnetic nanoparticles are aligned in a direction in which the energy of a system is minimized as a result of interaction between induced magnetic moments. The direction is parallel to the direction of the magnetic field, and the magnetic nanoparticles form a magnetic axis.

According to the above method, magnetic nanoparticles can be aligned in a material with an external magnetic field, thereby arbitrarily controlling a magnetic axis to adjust a magnetic property of the material. Also, magnetic nanoparticles may show rapid response and reversible magnetic induction in response to an external magnetic field.

When a magnetic field is applied from the outside, an attractive force caused by magnetism and a repulsive force caused by a static electrical force and a solvation force may be simultaneously exerted between the magnetic nanoparticles 120 existing in the curing material 110 in the colloidal state. Due to the balance between the attraction force and the repulsive force, the magnetic nanoparticles 120 are aligned at predetermined intervals and form a chain structure, thereby forming the magnetic axis. Thus, the distance d between the aligned magnetic nanoparticles 120 may be determined according to the intensity of the magnetic field. The stronger the intensity of the magnetic field, the smaller the distance d between the magnetic nanoparticles 120 aligned in the direction of the magnetic field may be. The intensity of the magnetic field may be 100 to 1,000 gauss. The distance d may be several to hundreds of nanometers according to the intensity of the magnetic field.

Figure 4:
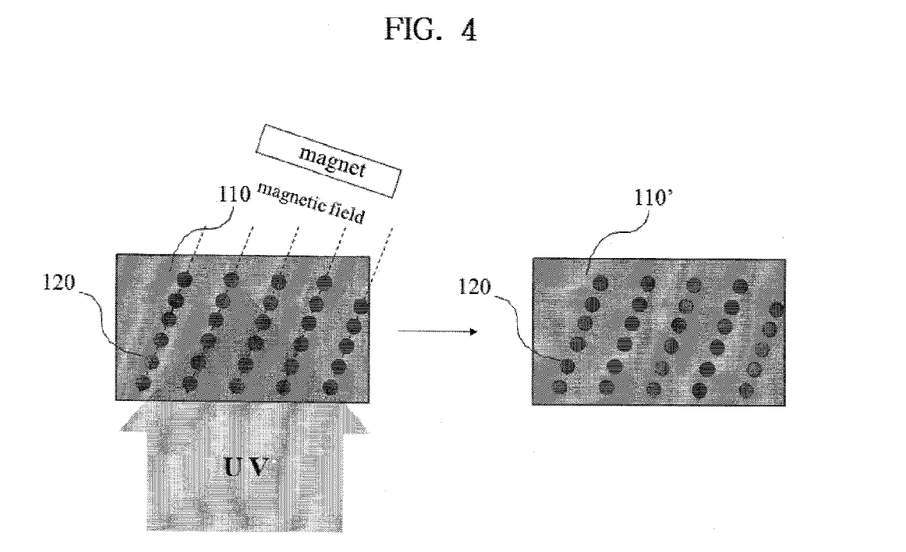
FIG. 4 illustrates a process in which magnetic axes are fixed by hardening a composition.

FIG. 4 illustrates a process in which magnetic axes are fixed by hardening a composition. As illustrated in the drawing, when the composition 100 including the curing material 110 and the magnetic nanoparticles 120 for fabricating a magnetic axis-controlled structure is exposed to a magnetic field and illuminated by UV light, a curing process is performed to form a solid medium 110'. As a result, a chain structure of the magnetic nanoparticles 120 may be fixed in the solid medium 110'. Thus, by applying the composition 100 for fabricating a magnetic axis-controlled structure to a predetermined substrate, a magnetic axis-controlled pattern can be formed on the substrate. The composition 100 for fabricating a magnetic axis-controlled structure can be readily manufactured at low cost, and multiple patterns having different magnetic properties can be formed from one kind of composition by applying the composition 100 onto a substrate.

Physical/chemical properties of the solid medium 110' may be adjusted by changing a molecular weight of the curing material 110, a concentration of the initiator, a UV-light irradiation time, and so on. By irradiating UV light to a specific pattern area, various patterns may be formed. A fine pattern may be formed by adjusting an irradiation area of an energy source such as UV light in the micrometer scale using, for example, mask lithography or optofluidic maskless lithography (OFML).

Due to hardening of the curing material 110, the solid medium 110' may consist of a crosslinked polymer. An interval between crosslinked polymer chains having a network structure may be 1 to several nanometers. The common magnetic nanoparticles 120 may have a size of about 150 to 170 nm and thus can be sufficiently fixed. The solvation layer 126 surrounds the surface of each of the magnetic nanoparticles 120, and a predetermined distance is maintained between the magnetic nanoparticles 120.

Consequently, using the above-described composition 100, a structure in which a magnetic axis is controlled by the magnetic nanoparticles 120 including a superparamagnetic material can be fabricated. The magnetic nanoparticles 120 included in the structure are aligned in at least one axial direction at predetermined intervals to constitute a chain structure, and form a magnetic axis having a magnetic property determined according to the predetermined intervals and/or the size of the magnetic nanoparticles 120. Through this process, a pattern of magnetic axis-controlled structures can be formed.

Figure 5:
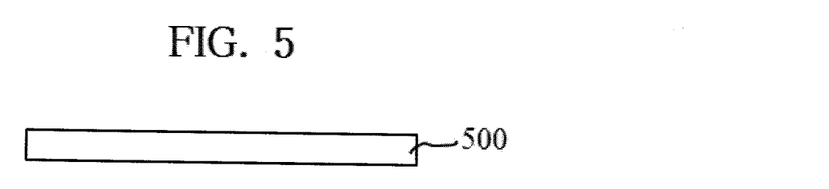
FIGS. 5 to 9 illustrate a method of fabricating a magnetic axis-fixed structure according to an embodiment of the present disclosure.

FIGS. 5 to 9 illustrate a method of fabricating a magnetic axis-controlled structure according to an embodiment of the present disclosure. Referring to FIG. 5, a substrate 500 is provided first. For a case in which light is used as an energy source, the substrate 500 may be formed of a transparent or semi-transparent material, for example, glass or plastic. Alternatively, a coating layer (not shown) may be further formed on the substrate 500. Here, the coating layer may prevent magnetic nanoparticles from gathering and cause a composition to be evenly applied. The coating layer may be formed by, for example, depositing a curing material on the substrate 500 and hardening the deposited curing material. As the deposition method, spray coating or dip coating may be used. For example, a solution including a hydrophilic polymer such as PEG may be used as the curing material, and hardened to form a hydrogel layer. Examples of the curing material from which hydrogel can be formed are the same as those of the curing material 110 described with reference to FIG. 1, and thus will not be reiterated.

Figure 6:
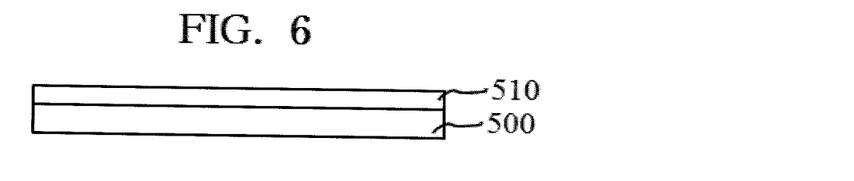

Referring to FIG. 6, a composition layer 510 including magnetic nanoparticles and the curing material is formed on the substrate 500. In an embodiment, the composition layer 510 may further include an initiator and/or a crosslinking agent for polymerization and crosslinking reaction. Detailed description of the composition layer 510 is the same as that of the composition 100 of FIG. 1 for fabricating a magnetic axis-controlled structure, and thus will not be reiterated.

Figure 7:
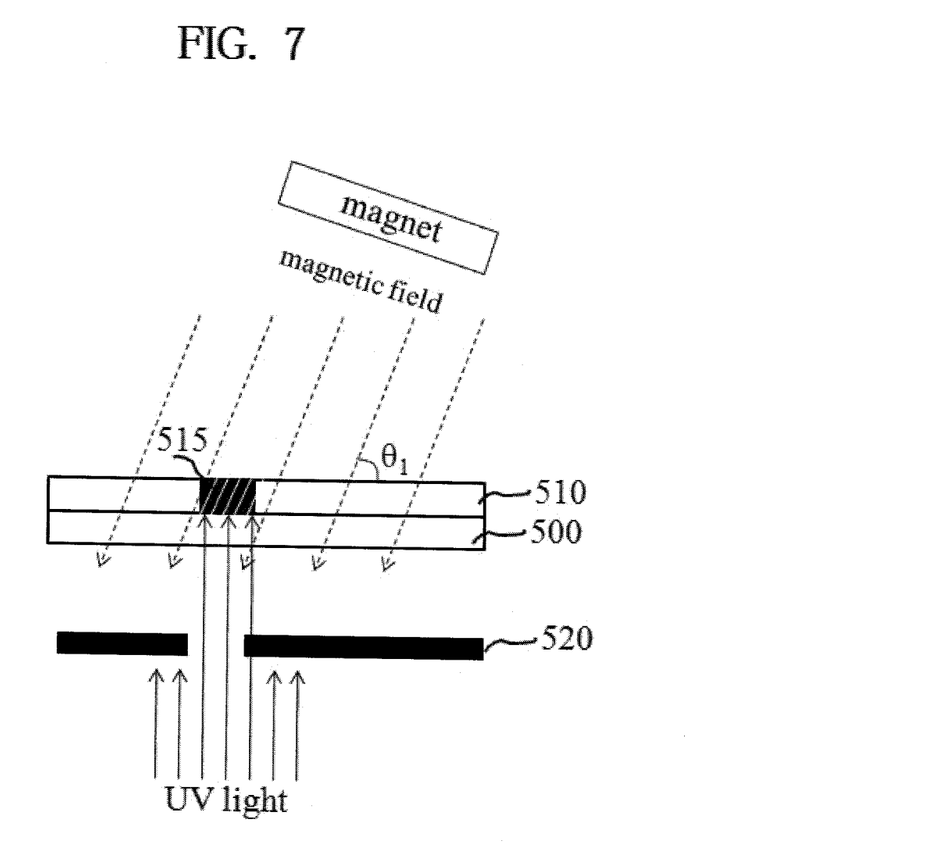

Referring to FIG. 7, a magnetic field is applied to the substrate 500 on which the composition layer 510 is deposited. The magnetic nanoparticles are aligned in the direction of the magnetic field generated from a magnet. For example, when the magnetic field is aligned at an angle of $\theta_1$ with respect to the substrate 500, the magnetic nanoparticles are aligned at the same angle of $\theta_1$ with respect to the substrate 500, thereby forming a magnetic axis. The magnetic field may be applied by a permanent magnet or electromagnet disposed above the composition layer 510. At this time, the intensity of the magnetic field may be varied by changing the distance between the permanent magnet and the substrate 500 or adjusting the level of current or voltage flowing through a coil wound around the electromagnet.

As illustrated in FIG. 7, a portion of the composition layer 510 is hardened while the magnetic field is maintained in the predetermined direction. For hardening, patterned UV light through a mask 520 is irradiated. An energy source used for hardening may be heat, visible light, infrared light, and electron beams in addition to UV light. For effective irradiation of UV light, the substrate 500 may be formed of a material transparent to UV light. As the mask 520 used for patterning, any kind of mask through which an energy such as heat and light can be applied to and harden the portion of the composition layer 510 may be used. For example, a static mask or dynamic mask may be used. As an example of the dynamic mask, a digital micromirror device (DMD) may be used. Thus, when a radical polymerization reaction is caused by heat or light energy passed through the mask 520 and the portion of the composition layer 510 is hardened, the composition layer 510 of the hardened portion can continuously maintain the magnetic axis in the predetermined direction even if the magnetic field is removed. By irradiating patterned UV light, an area may be patterned into a structure having a magnetic axis in a specific direction. While the magnetic field is present, the portion of the composition layer 510 is hardened to form a first hardened area 515.

Figure 8:
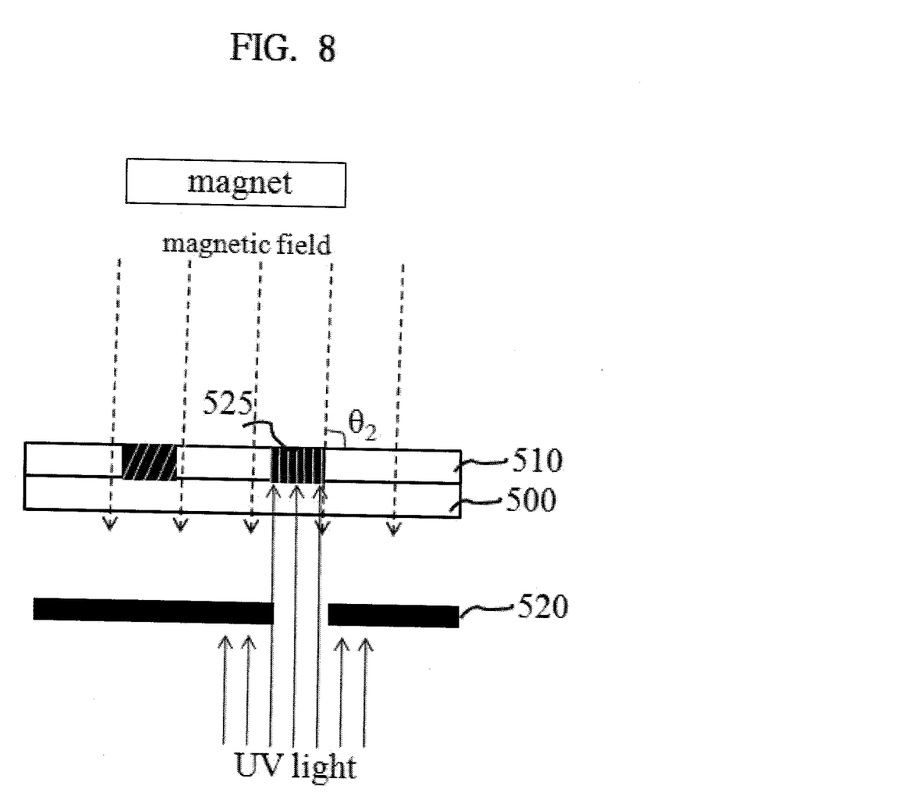

Referring to FIG. 8, a magnetic field is additionally applied at an angle of $\theta_2$ rather than the angle of $\theta_1$ in the same way as described with reference to FIG. 7. At the same time, UV light is irradiated to a portion of the composition layer 510 other than the first hardened area 515, thereby forming a second hardened area 525 having a magnetic axis in a different direction from the first hardened area 515. The sizes of the respective patterned areas may be several to hundreds of micrometers. By repeating the processes of FIGS. 7 and 8, hardened areas having magnetic axes in several directions may be formed.

Figure 9:
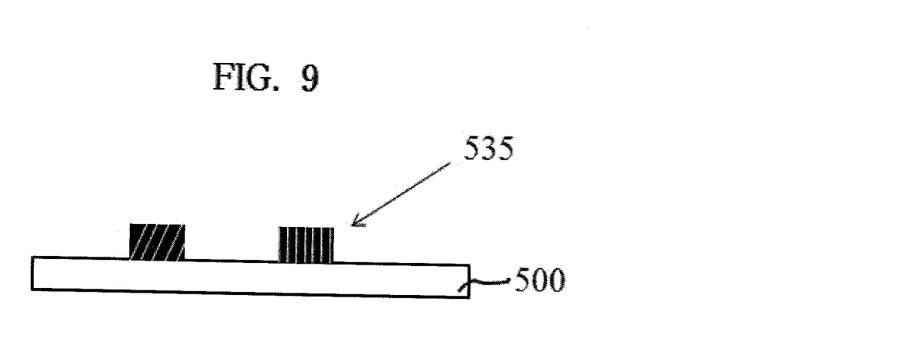

Referring to FIG. 9, the remaining composition layer 510 that has not been hardened is removed. To remove the remaining composition layer 510, a solvent such as ethanol may be used. After the remaining composition layer 510 is removed, a magnetic axis-controlled pattern 535 may be formed on the substrate 500 through a drying process. When an external magnetic field is applied to the formed magnetic axis-controlled pattern 535 from a specific direction, magnetic forces induced from the respective magnetic axes may vary according to the distance between magnetic nanoparticles forming the magnetic axes and the directions of the magnetic axes.

Using the above-described methods, magnetic axes-controlled multiple patterns can be fabricated. The multiple patterns may be fabricated by repeating forming and fixing of magnetic axes while changing the direction of a magnetic field for different areas in a composition layer. The multiple patterns may include a solid medium and the plurality of areas having magnetic axes fixed in the solid medium. The solid medium may be a crosslinked polymer. The magnetic axis may be a set of magnetic nanoparticles that are aligned in one axial direction at predetermined intervals. The respective areas may include magnetic axes in a specific direction, and the magnetic axes in the different areas may be in the same or different directions.

Figure 10:
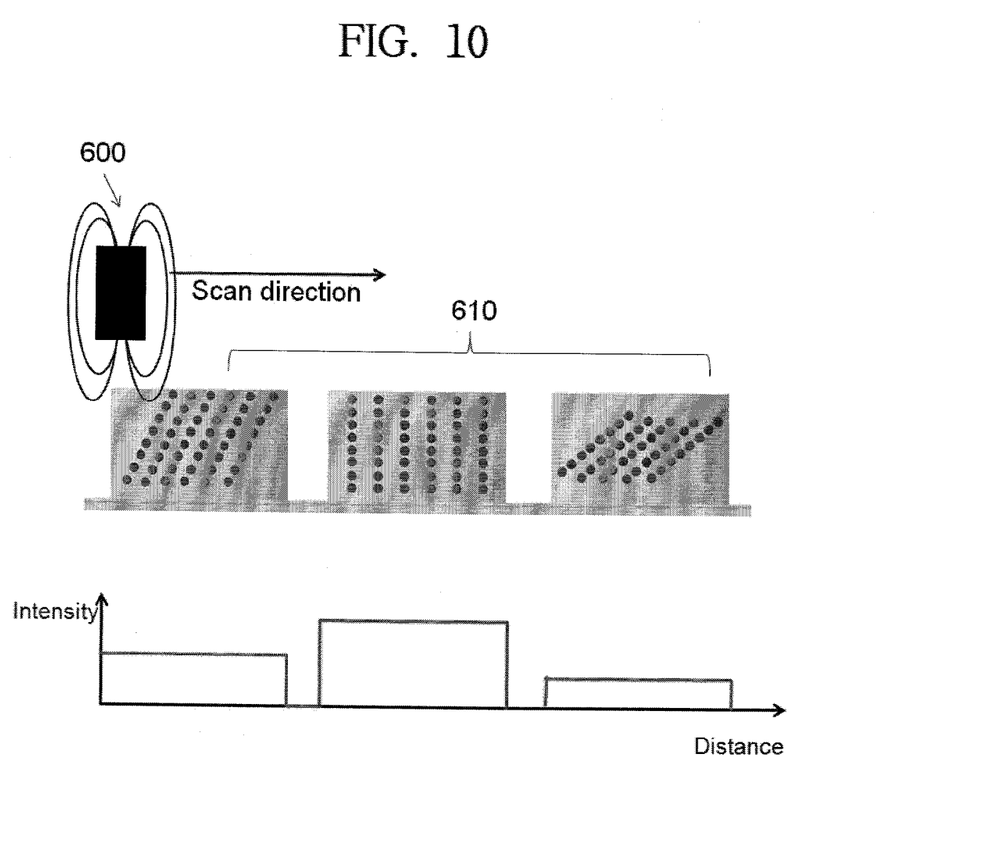
FIG. 10 illustrates a magnetic induction response of magnetic axes-controlled multiple patterns.

In an embodiment, a method of measuring induced magnetic forces of magnetic axes-controlled multiple patterns is provided. FIG. 10 illustrates a magnetic induction response of magnetic axes-controlled multiple patterns. For example, when an external magnetic field is applied vertically to the multiple patterns, magnetic forces in vertical direction induced from respective magnetic axes in different regions may differ from each other since the magnetic axes are inclined at different angles. Referring to FIG. 10, a magnetic field generated from a magnetic sensor 600 having an external magnetic source or self-magnetic source is applied to the multiple patterns. At this time, when the magnetic sensor 600 scans multiple patterns 610 having magnetic axes inclined at different angles, different magnitudes of induced magnetic force may be measured according to positions. The induced magnetic force may be a function of the intensity of the magnetic field, the size of magnetic nanoparticles, the distance between the magnetic nanoparticles, and the directions of the magnetic axes. For example, as the intensity of the magnetic field increases, the size of the magnetic nanoparticles increases, or the directions of the magnetic axes become similar to the direction of the magnetic field, the induced magnetic force may increase. Based on this principle, magnetic axes-controlled multiple patterns can be used in the field of anti-counterfeiting.

In the above-described methods, a composition including magnetic nanoparticles and a curing material is used so that a magnetic axis can be controlled by merely changing the direction of a magnetic field. Also, the magnetic axis formed of magnetic nanoparticles is fixed by hardening the curing material so that a layer having a desired shape and keeping the magnetic axis fixed can be formed on a substrate.

The foregoing is illustrative of the present disclosure and is not to be construed as limiting thereof. Although numerous embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A method of measuring an induced magnetic force, comprising:

applying a magnetic field to multiple patterns having controlled magnetic axes provided in a solid medium, wherein the multiple patterns includes a first solid area having first controlled magnetic axes each fixed in the first solid area in a first direction and a second solid area having second controlled magnetic axes each fixed in the second solid area in a second direction which is different from the first direction, wherein each controlled magnetic axis in the first and second controlled magnetic axes is formed by a chain structure which has an alignment structure of magnetic nanoparticles aligned in a predetermined direction; and scanning the multiple patterns having the controlled magnetic axes while applying the magnetic field, wherein the scanning of the multiple patterns includes measuring induced magnetic forces induced by the applied magnetic field and the first and second controlled magnetic axes from the first and second solid areas, wherein each induced magnetic force is a function of an intensity of the applied magnetic field, a size of the magnetic nanoparticles, a distance between the magnetic nanoparticles, and directions of each controlled magnetic axes, and wherein the induced magnetic force increases when the intensity of the magnetic field increases, the size of the magnetic nanoparticles increases or the directions of the magnetic axes become similar to the direction of the magnetic field;

wherein a first interparticle distance of each first controlled magnetic axis is different from a second interparticle distance of each second controlled magnetic axis; and wherein said applying a magnetic field to the multiple patterns and said scanning of the multiple patterns are occurred simultaneously and are performed by a magnetic sensor.

2. The method according to claim 1, wherein the solid medium is a crosslinked polymer.

3. The method according to claim 1, wherein each of the magnetic nanoparticle is surrounded by a solvation layer.

4. The method of claim 1, wherein the first solid area and the second solid area are provided on a same substrate.

* * * * *